US006861849B2

United States Patent
Chiba

(10) Patent No.: US 6,861,849 B2
(45) Date of Patent: Mar. 1, 2005

(54) CAPACITY MEASURING DEVICE AND CAPACITY MEASURING METHOD

(75) Inventor: Tadashi Chiba, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/609,408

(22) Filed: Jul. 1, 2003

(65) Prior Publication Data

US 2004/0008037 A1 Jan. 15, 2004

(30) Foreign Application Priority Data

Jul. 9, 2002 (JP) ........................................ 2002-200193

(51) Int. Cl.[7] .............................................. G01R 27/26
(52) U.S. Cl. ........................ 324/663; 324/658; 324/548
(58) Field of Search ............................... 324/658, 663, 324/457, 548, 686, 73.1, 158.1, 765

(56) References Cited

U.S. PATENT DOCUMENTS 6,348,809 B1 * 2/2002 Hirota et al. ............... 324/765

FOREIGN PATENT DOCUMENTS

JP 2000-55956 2/2000

* cited by examiner

*Primary Examiner*—N. Le
*Assistant Examiner*—Vincent Q. Nguyen
(74) *Attorney, Agent, or Firm*—Takeuchi & Takeuchi

(57) ABSTRACT

The capacity measuring device comprises a transistor (40) formed on a silicon substrate and having a drain, source, and gate regions (41, 42, and 43), extension metals (51–54) to be connected to the regions, a guard electrode (55) surrounding the extension metal (53) for the gate region, measurement pads (61–64) electrically connected to the extension metals, the guard rings (61g–64g) surrounding the measurement pads and connected to the guard electrode (55). Accordingly, the infinitesimal capacity between any regions of the transistor in full scale is accurately measured by connecting the guard electrode (55) to a guard terminal of an infinitesimal capacity measuring apparatus for canceling the parasitic capacity.

6 Claims, 4 Drawing Sheets

1

CAPACITY MEASURING DEVICE AND CAPACITY MEASURING METHOD

BACKGROUND OF THE INVENTION

1. Field of the Invention

This invention relates to a layout pattern for measuring the parameter of a device that is necessary for the simulation of a semiconductor device, especially a capacity measuring device and a capacity measuring method for measuring infinitesimal capacity.

2. Description of the Related Art

In the design of a semiconductor integrated circuit including LSI, simulation, such as the Simulation Program with IC Emphasis (SPICE), is used to evaluate the operational characteristics of a designed circuit. It is necessary that the parameter value of an individual transistor used as a model be close to the characteristic value of an actual transistor to obtain an accurate result in the simulation. Especially, the electrostatic capacity at the gate of a Metal Oxide Semiconductor (MOS) transistor has large influence on the transient response of the circuit. Accordingly, the accurately measured value is desired.

In the early years of the semiconductor integrated circuit with less miniaturization, it was possible to obtain a relatively accurate parameter by forming on an actual semiconductor substrate a layout for measuring capacity, which comprises a transistor pattern in full scale, a pad for contact with a measurement prober, and an extension metal for connecting the transistor and the pad, and measuring the layout pattern.

As the size of the transistor is made smaller with the miniaturization of the semiconductor device, the gate capacity of the transistor changed to the order of $f(10^{-15})F$ from the order of $p(10^{-12})F$. However, the size of the measurement prober was unable to be proportionally miniaturized so that the minute capacity could not be measured. Consequently, the capacity measurement using the layout pattern comprising the transistor in full scale became impossible. Accordingly, as a new method, a layout pattern comprising a model transistor having a size a few hundreds larger than the actual transistor is measured and the measurement result is theoretically converted to obtain the parameter.

FIG. 2 is a top view of a conventional layout pattern for measuring the gate capacity.

The layout pattern is formed on a silicon substrate and comprises a transistor 1 having a size a few hundreds larger than that of the actual transistor. The transistor 1 is formed in a semiconductor well (not shown) and composed of a drain region 1d, a source region 1s, and a gate region 1g. A wiring pattern made of a metal film is formed on the surface of the silicon substrate, on which the transistor 1 is formed, via an insulating layer (not shown).

The wiring pattern is composed of an extension metal 2d and a pad 3d for a drain electrode, an extension metal 2s and a pad 3s for a source electrode, an extension metal 2g and a pad 3g for a gate electrode, and an extension metal 2w and a pad 3w for the well. The extension metals 2d, 2s, 2g, and 2w are electrically connected to the drain 1d, source 1s, and gate regions 1g, and the well, respectively, by contact metals via through-holes 4d, 4s, 4g, and 4w.

For example, the pads 3d, 3s, and 3w are commonly connected to the ground GND and the electrostatic capacity between the pad 3g for the gate electrode and the ground GND is measured by using the above-described layout pattern. Then, the measured value is converted into the parameter for the simulation according to the proportion of the size of the pattern to that of the actual device.

However, the parameter obtained by the theoretical conversion according to the proportion of the sizes is different from the actual value, which causes the problem that the result of the simulation differs from the result of the measurement in the operation of the actual device.

Meantime, to solve the above problem, an infinitesimal capacity measuring system capable of measuring infinitesimal capacity of the order of fF has become known.

FIGS. 3(a)–3(c) show the infinitesimal capacity measuring system described in Japanese Patent Kokai No. 2000-55956.

As shown in FIG. 3(a), the infinitesimal capacity measuring system is composed of a prober 10 and a measuring circuit 20. The prober 10 comprises a shield case 11 having a stage 12, on which a device 30 to be measured is mounted, and coaxial cables 13 and 14 to be connected to the device 30. Probes are provided at the front ends of inside conductors 13a and 14a of the coaxial cables 13 and 14 such that they are brought into contact with any electrodes of the device 30 by manipulators 15 and 16.

Outside conductors 13b and 14b of the coaxial cables 13 and 14 are brought into contact with the shield case 11. The rear ends of the coaxial cables 13 and 14 extend outside the shield case 11 and are connected with the measuring circuit 20 and the ground potential GND, respectively. FIG. 3(b) shows the status of the connection between the device 30 and the coaxial cables 13 and 14 during the measurement. For example, the device 30 comprises a lower electrode 33 formed on a silicon substrate 31 via an insulating layer 32 and a measurement electrode 35 formed on the lower electrode 33 via an insulating layer 34. The front end of the inside conductor 13a of the coaxial cable 13 is brought into contact with the surface of the lower electrode 33 and the rear end of the coaxial cable 13 is connected to the measurement circuit 20. The front end of the inside conductor 14a of the coaxial cable 14 is brought into contact with the surface of the measurement electrode 35 and the rear end of the coaxial cable 14 is connected to the ground potential GND.

FIG. 3(c) is a schematic diagram of the capacity measuring circuit. The measurement electrode 35 of the device 30 is connected to the ground potential GND through the coaxial cable 14. The lower electrode 33 of the device 30 is led to the measurement circuit 20 through the inside conductor 13a of the coaxial cable 13 and connected to an inverting input terminal of an operational amplifier 21. The output side of the operational amplifier 21 is connected to an output terminal 22 and the inverting input terminal through a feedback resistor 23.

The outside conductor 13b of the coaxial cable 13 is connected to the non-inverting input terminal of the operational amplifier 21 without being connected to the ground potential GND. Also, an alternating current signal generator 24 is connected to the non-inverting input terminal of the operational amplifier 21.

In the above-described structure, conductive parts of the prober 10, such as the shield case 11, conductive parts of the stage 12, conductive parts of the manipulators 15 and 16, the rear surface of the silicone substrate 31, are connected to the non-inverting input terminal of the operational amplifier 21. On the other hand, an electrode of a measured capacity CX or the lower electrode 33 is connected to the inverting input terminal of the amplifier 21 through the coaxial cable 13. The other electrode of the measured capacity CX or measurement electrode 35 is connected to the ground potential GND through coaxial cable 14.

Negative feedback is loaded on the amplifier 21 through the feedback resistor 23, and since the open-loop voltage gain thereof is substantially infinite, the input side of the operational amplifier 21 is put in the state of imaginary short-circuit so that the difference of voltage between the inverting and non-inverting input terminals is substantially zero. When an AC signal having a voltage Vi and an angular frequency ω is applied to the non-inverting input terminal of the operational amplifier 21 from the AC signal generator 24, the output voltage Vo at the output terminal 22 is shown in the following formula (1):

$$Vo = Vi(1 + j\omega Rf \cdot Cx) \quad (1)$$

wherein Rf is the resistance of the feedback resistor 23.

Accordingly, the measured capacity Cx can be calculated from the formula (1) by measuring the output voltage Vo.

Since the operational amplifier 21 is in the state of the imaginary short-circuit, the floating capacity which is considered to be produced between the inside and outside conductors 13a and 13b of the coaxial cable 13, such as a parasitic capacity produced in the shield case 11, is canceled. Accordingly, infinitesimal capacity of the order of fF can be measured.

That is, the above-described infinitesimal capacity measuring system, instead of the layout pattern shown in FIG. 2, makes it possible to measure the gate capacity of the layout pattern, in which a transistor is formed in an actual size. However, the conventional layout pattern for measuring the gate capacity has the following problem.

In FIG. 2, the size of the transistor 1 can be made as small as that of the actual transistor. However, the measurement pads 3d and 3g used for measurement of the electrostatic capacity between the electrodes of the transistor cannot be made small because of physical limitation of the measuring equipment. If only the transistor 1 is made small, the electrostatic capacity between the pads or the parasitic capacity is much larger than that of the electrostatic capacity between the electrodes of the transistor so that the electrostatic capacity between the electrodes cannot be accurately measured.

SUMMARY OF THE INVENTION

Accordingly, an object of the invention is to provide a capacity measuring device and a capacity measuring method capable of accurately measuring the electrostatic capacity between gate or other electrodes of the transistor by using a layout pattern in full scale.

In order to achieve the object, a capacity measuring device comprises an electric element having a plurality of electrodes, a plurality of first terminals each electrically connected to each one of the electrodes of the electric element, a plurality of guard rings made of conductors and arranged such that the guard rings surround the first terminals, and a second terminal electrically connected to the guard rings.

The capacity measuring device according to the present invention is used, for example, for the following application.

A device pattern, such as a MOS transistor, is formed on a semiconductor substrate. A plurality of electrodes of the MOS transistor, such as gate and drain electrodes, are connected to the first terminals through respective extension metal wirings. The guard rings made of conductors are formed such that they surround the first terminals, and connected to the second terminal. The second terminal is connected to a guard terminal which is provided in the infinitesimal capacity measuring system for canceling the parasitic capacity. Then, the electrostatic capacity between two first terminals is measured so that the gate capacity of the MOS transistor is accurately found.

BRIEF DESCRIPTION OF THE DRAWINGS

FIG. (1a) is a top view of the uppermost metal pattern of a layout pattern for measuring a gate capacity according to the first embodiment of the present invention.

FIG. (1b) is a top view of the lowermost wiring pattern of the layout pattern of FIG. (1a).

DESCRIPTION OF THE PREFERRED EMBODIMENTS

First Embodiment

Figure 1A:
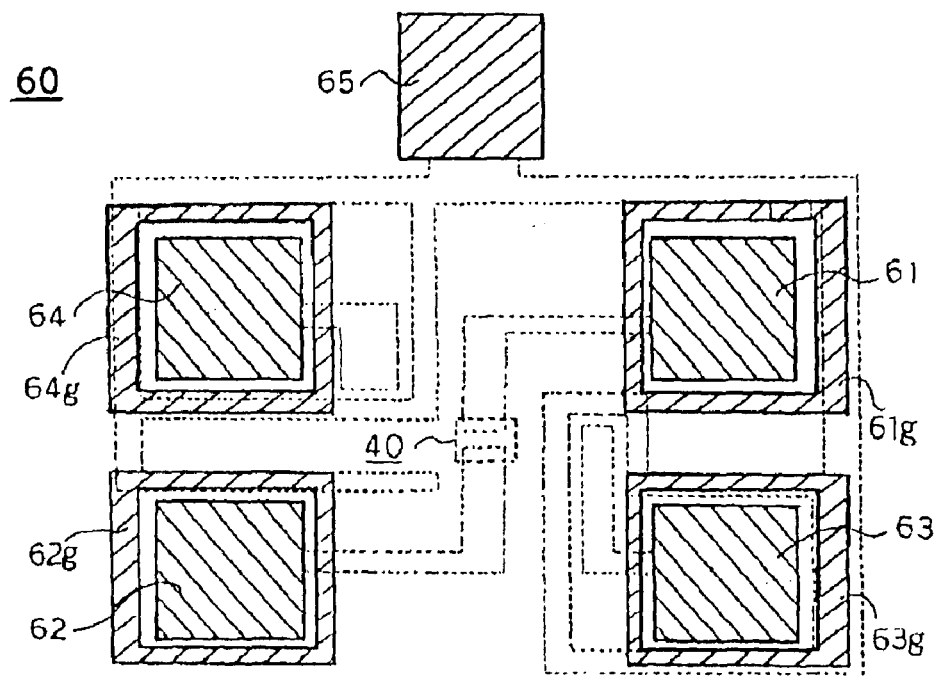
Figure 1B:
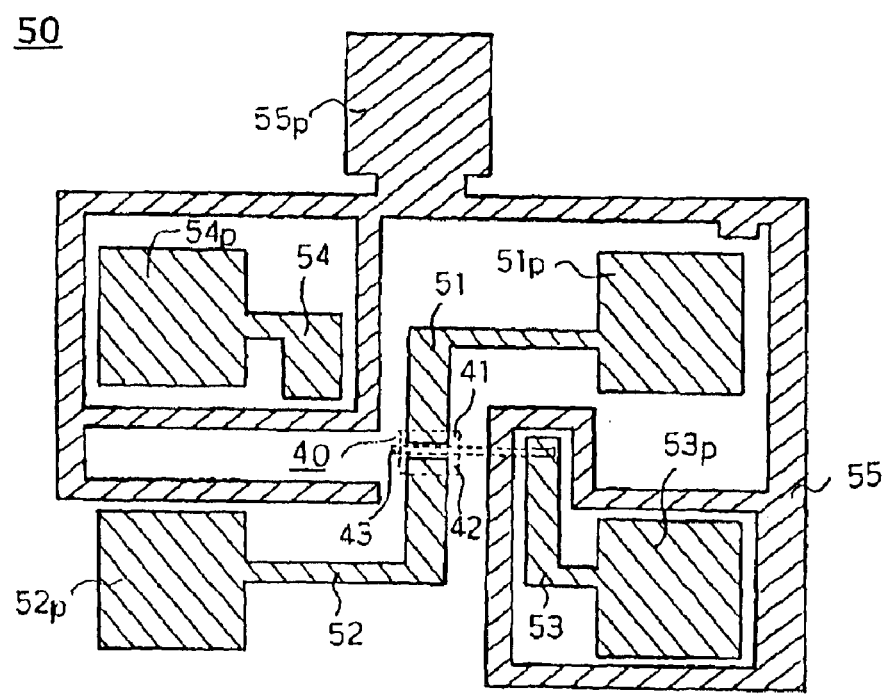
Figure 2:
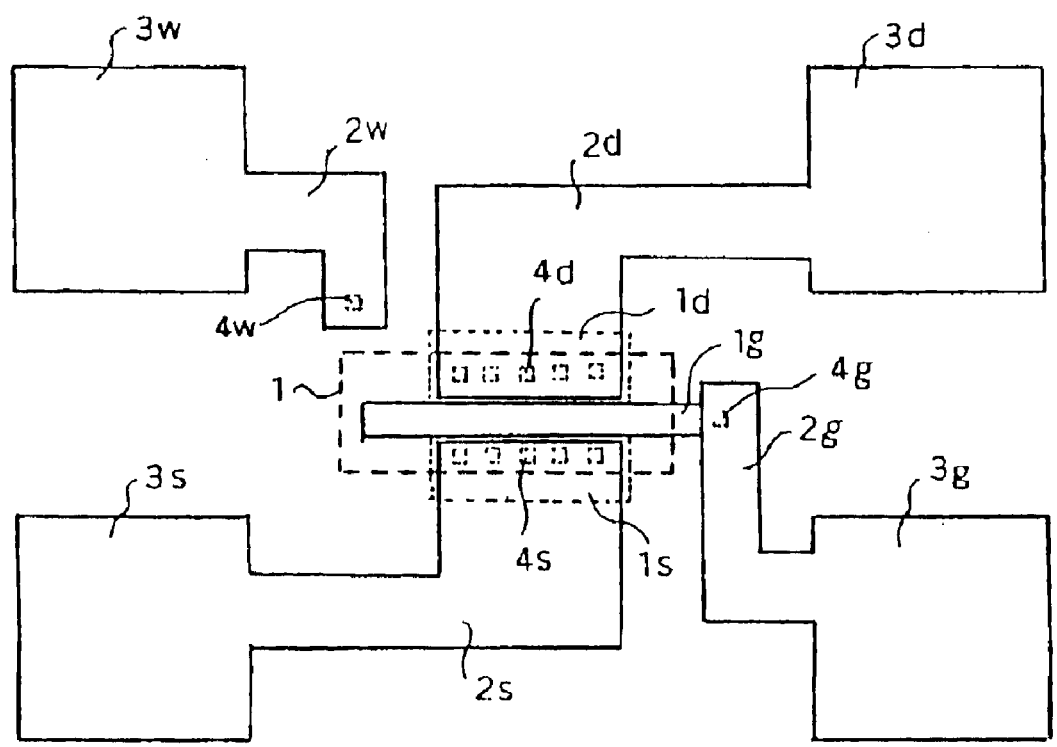
FIG. 2 is a top view of a conventional layout pattern for measuring a gate capacity.

In FIGS. 1(a) and 1(b), a layout pattern is formed on a silicon substrate and comprises a transistor 40 which is formed substantially in full scale. The transistor 40 is formed in a semiconductor well (not shown) and composed of a drain region 41, a source region 42, and a gate region 43. A lowermost wiring pattern 50 made by a metal film is formed on the surface of the silicon substrate, on which the transistor 40 is formed, via an insulating layer (not shown).

The wiring pattern 50 comprises an extension metal 51 and a pad 51p for a drain electrode, an extension metal 52 and a pad 52p for a source electrode, an extension metal 53 and a pad 53p for a gate electrode, and an extension metal 54 and a pad 54p for the well. The drain region 41 and the extension metal 51 are electrically connected by a contact metal through a through-hole (not shown). Similarly, the source region 42, the gate region 43, and the well are electrically connected with the extension metals 52, 53, and 54, respectively, by contact metals via through-holes (not shown).

The wiring pattern 50 further comprises a guard electrode 55 and a pad 55p. The guard electrode 55 is continuously formed with the pad 55p such that it surrounds the extension metal and pad 53 and 53p for the gate electrode. Moreover, the guard electrode 55 is formed such that it fills up open spaces on a plane between the extension metals 51 to 54 and the pads 51p to 54p.

The dimension and location of the pads 51p to 54p are determined regardless the size of the transistor 40 but according to the size of a probe of measuring equipment. For example, the pads 51p and 53p are regular squares with sides each having a length of 50 μm and the distance therebetween is 50 μm.

The extension metals 51–54, pads 51p–54p, guard electrode 55, and pad 55p of the wiring pattern 50 are simultaneously formed by the same process. An uppermost metal pattern 60 is formed on the wiring pattern 50 via an insulating layer (not shown).

As shown in FIG. (1a), the metal pattern 60 comprises pads 61–65 corresponding to the pads 51p–55p, respectively. Guard rings 61g–64g are formed such that they surround the pads 61–64, respectively.

The pads 61–65 are electrically connected with the pads 51p–55p, respectively, by contact metals via through-holes (not shown). The guard rings 61g to 64g are electrically connected with the guard electrode 55 by contact metals via through-holes (not shown) provided at predetermined points. The pads 61–65 and the guard rings 61g–64g are simultaneously formed by the same process.

Figure 3A:
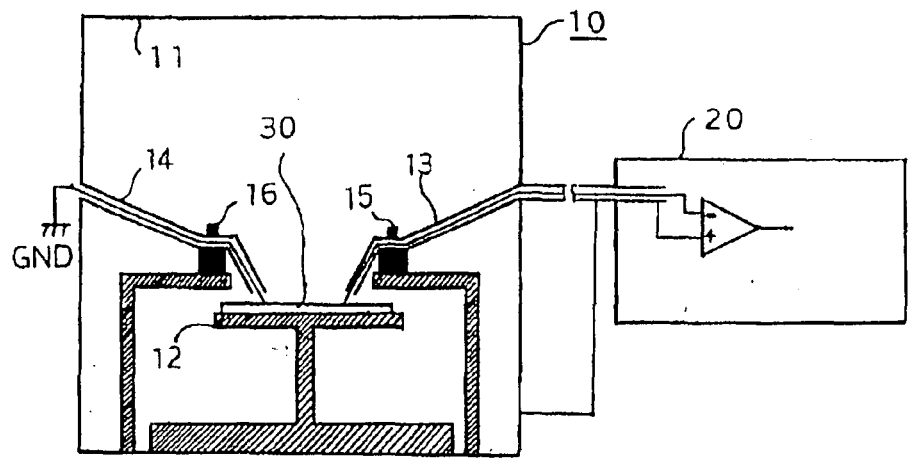
FIGS. 3(a)–3(c) show the infinitesimal capacity measuring system.

When the gate capacity of the transistor 40 is measured by the above-described layout pattern for measuring gate capacity, the silicon substrate carrying the layout pattern is mounted on the stage 12 of the prober 10 of the infinitesimal capacity measuring system shown in FIG. 3(a). The pad 65 corresponding to the guard electrode 55 is electrically connected to the shield case 11. The inside conductor 14a of the coaxial cable 14 is brought into contact with the pad 63 corresponding to the gate region 43 and the inside conductor 13a of the coaxial cable 13 is brought into contact with the pad 61 corresponding to the drain region 41 so that the electrostatic capacity between the gate and drain regions 43 and 41 is measured.

Figure 3B:
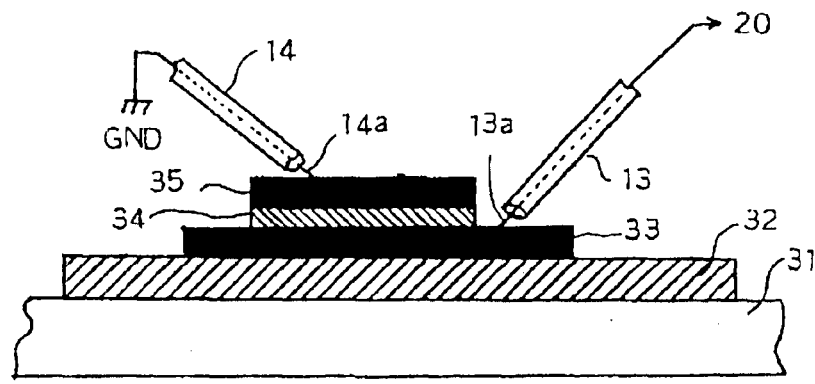
Figure 3C:
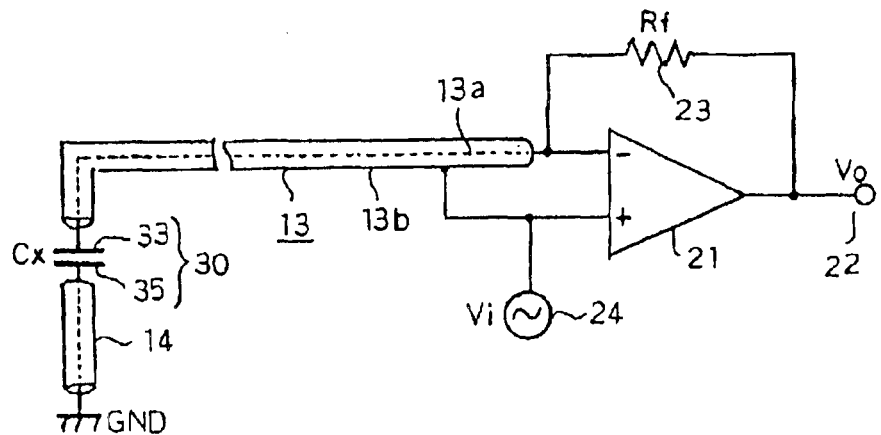

As described above, in the infinitesimal capacity measuring system shown in FIG. 3, the electrostatic capacity between the inside and outside conductors 13a and 13b is canceled. Consequently, in the layout pattern, the parasitic capacity between the drain region 41 and the guard electrode 55 is canceled so that the net electrostatic capacity between the drain and gate regions 41 and 43 of the transistor 40 is accurately measured.

The layout pattern for measuring the gate capacity according to the first embodiment of the present invention comprises the guard electrode 55 which is formed such that it surrounds the extension metal 53 and the pad 53p connected to the gate region 43 of the transistor 40 to be measured and the guard rings 61g to 64g which are formed such that they surround the respective pads 61 to 64 for connecting the measuring equipment. Accordingly, for example, when the gate capacity is measured by the infinitesimal capacity measuring system shown in FIG. 3, the very small gate capacity is accurately measured without the influence of the parasitic capacity so that the electrostatic capacity between electrodes of the transistor of full scale is precisely measured.

Second Embodiment

Figure 4A:
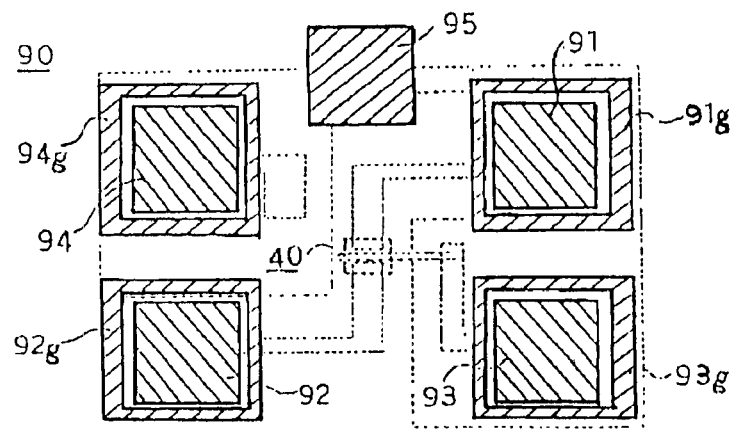
FIG. 4(a) is a top view of the uppermost metal pattern of a layout pattern for measuring a gate capacity according to the second embodiment of the present invention
Figure 4B:
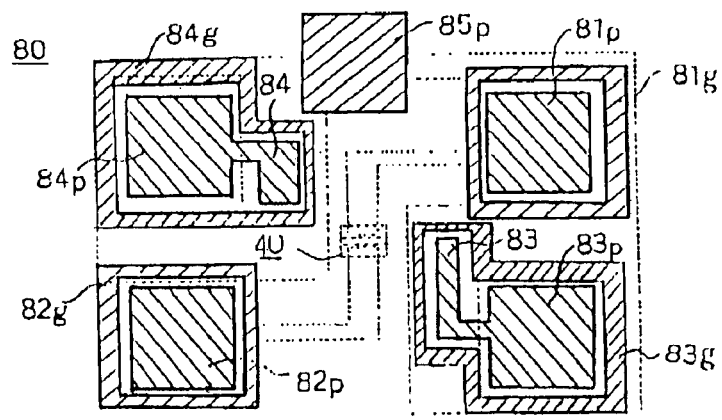
FIG. 4(b) is a top view of an intermediate wiring pattern of the layout pattern of FIG. 4(a).
Figure 4C:
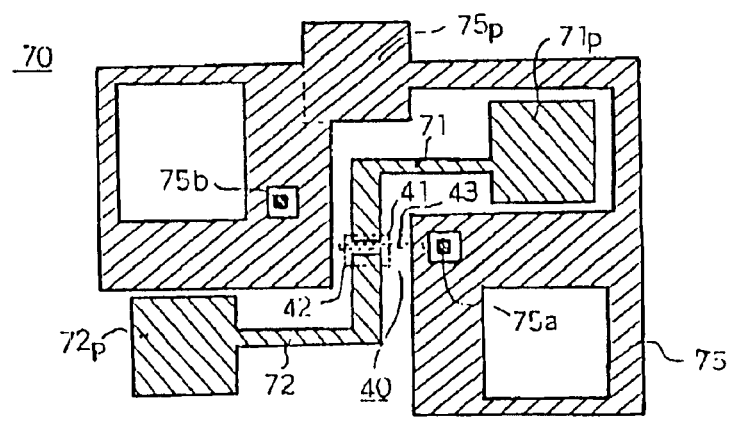
FIG. 4(c) is a top view of the lowermost wiring pattern of the layout pattern of FIG. 4(a).

In FIGS. 4(a) to 4(c), a layout pattern shown comprises a second wiring pattern between the uppermost metal pattern and the lowermost wiring pattern. The uppermost metal pattern including a pad for the measuring equipment, the lowermost wiring pattern formed on the surface of the transistor via an insulating layer, and the second wiring pattern formed between the uppermost metal pattern and the lowermost wiring pattern via an insulating layer are shown in FIGS. 4(a), 4(c), and 4(b), respectively.

The layout pattern is formed on a silicon substrate so as to comprise a transistor 40 which is formed substantially in full scale as shown in FIG. 4(c). The transistor 40 is formed in the semiconductor well (not shown) and composed of the drain region 41, the source region 42, and the gate region 43. A lowermost wiring pattern 70 of a metal film is formed on the surface of the silicon substrate, on which the transistor 40 is formed, via an insulating layer (not shown).

The wiring pattern 70 comprises an extension metal 71 and a pad 71p for a drain electrode, an extension metal 72 and a pad 72p for a source electrode, and metals 75a and 75b. The drain region 41 and the extension metal 71 are electrically connected by a contact metal via a through-hole (not shown). Similarly, the source region 42 is electrically connected with the extension metal 72 by a contact metal via a through-hole (not shown).

The wiring pattern 70 further comprises a guard electrode 75 and a pad 75p. The guard electrode 75 is continuously formed with the pad 75p such that it fills up open spaces on a plane between the extension metals 71 and 72 and the pads 71p and 72p.

The metals 75a and 75b are provided in windows of the guard electrode 75 and electrically connected to the gate region 43 and the well (not shown) of the transistor 40, respectively, by contact metals via through-holes (not shown). The second wiring pattern 80 is formed on the wiring pattern 70 via an insulating layer (not shown).

As shown in FIG. 4(b), the wiring pattern 80 comprises an extension metal 83 and a pad 83p for a gate electrode and an extension metal 84 and a pad 84p for the well. The metals 75a and 75b are electrically connected to the extension metals 83 and 84, respectively, by contact metals via through-holes (not shown). The metals 75a and 75b are isolated from the metals 83 and 84, respectively, by insulating layers.

The wiring pattern 80 further comprises pads 81p, 82p, and 85p corresponding to pads 71p, 72p, and 75p, of the wiring pattern 70, respectively. Guard rings 81g to 84g are formed such that they surround the pads 81p to 84p.

The pads 81p and 82p are electrically connected with the pads 71p and 72p, respectively, by contact metals via through-holes (not shown). The guard rings 81g to 84g are electrically connected with the guard electrode 75 by contact metals via through-holes (not shown) provided at necessary points. An uppermost metal pattern 90 is formed on the wiring pattern 80 via an insulating layer (not shown).

As shown in FIG. 4(a), the wiring pattern 90 comprises pads 91 to 95 corresponding to pads 81p to 85p of the wiring pattern 80, respectively. Guard rings 91g to 94g are formed such that they surround the pads 91 to 94.

The pads 91 to 95 are electrically connected with the pads 81p to 85p, respectively, by contact metals via through-holes (not shown). The guard rings 91g to 94g are electrically connected with the guard rings 81g to 84g, respectively, by contact metals via through-holes (not shown) provided at necessary points.

When the gate capacity of the transistor 40 is measured by the above-described layout pattern for measuring gate capacity, the silicon substrate carrying the layout pattern is mounted on the stage 12 of the prober 10 of the infinitesimal capacity measuring system shown in FIG. 3(a). The pad 95 corresponding to the guard electrode 75 is electrically connected to the shield case 11. The inside conductor 14a of the coaxial cable 14 is brought into contact with the pad 93 corresponding to the gate region 43 and the inside conductor 13a of the coaxial cable 13 is brought into contact with the pad 91 corresponding to the drain region 41 so that the electrostatic capacity between the gate and drain regions 43 and 41 is measured.

As described above, in the infinitesimal capacity measuring system shown in FIG. 3, the electrostatic capacity between the inside and outside conductors 13a and 13b of the coaxial cable 13 is canceled. Consequently, in the layout pattern, the parasitic capacity between the drain region 41 and the guard electrode 75 and the parasitic capacity between the guard rings 81g to 84g and 91g to 94g are canceled so that the net electrostatic capacity between the drain and gate regions 41 and 43 of the transistor 40 is accurately measured.

The layout pattern for measuring the gate capacity according to the second embodiment comprises the guard electrode 75 which is formed such that it surrounds the extension metal 83 and the pad 83p connected to the gate region 43 of the transistor 40 to be measured and the guard rings 81g to 84g and 91g to 94g which are formed such that they surround the respective pads 81p to 84p and 91p to 94p for connecting the measuring equipment. Accordingly, even when the layout includes a multilayer wiring pattern, the same effects as those in the first embodiment are obtained.

The present invention is not limited to the above-described embodiments and various variations are possible including the following examples.

(a) The layout having a single-layer wiring pattern and a multilayer wiring pattern are described in FIGS. 1 and 4, respectively. However, the present invention is applicable to a layout having a plurality of wiring patterns.

(b) The present invention is applicable to the layout pattern for measuring not only the gate capacity of the transistor but also infinitesimal capacity of other devices.

(c) The shape, dimension, and position of the guard electrode and so forth are not limited to the examples in the embodiments.

(d) The layout pattern may be used for measuring capacity not only between the pads 61 and 63 but also between any pads.

(e) In the embodiments, the infinitesimal capacity measuring system shown in FIG. 3 is used in the layout pattern of the measuring equipment. However, any system which cancels the parasitic capacity by the guard electrode may be useful.

As described above, according to the first aspect of the present invention, the capacity measuring device comprises the element having the electrodes, the first terminals each electrically connected to each one of the electrodes, the guard rings made of conductors and arranged such that they surround the first terminals, and connected to the second terminal. Accordingly, the infinitesimal capacity between any two first terminals is accurately measured by using the infinitesimal capacity measuring system having the guard terminal for canceling the parasitic capacity.

According to the second aspect of the invention, the capacity measuring device comprises the extension metal wirings, the guard electrode formed such that it surrounds the extension metal wirings, and the guard terminal for connecting the guard electrode to the measuring apparatus. Accordingly, the infinitesimal capacity between any regions of the device formed in full scale is accurately measured by using the infinitesimal capacity measuring system having the guard terminal for canceling the parasitic capacity.

According to the third aspect of the invention, the capacity measuring device comprises the guard electrode formed such that it surrounds the extension metal wirings. Accordingly, even when the measuring device has the first and second extension metal wirings which are formed by two processes, the same effects as that of the first aspect of the invention is achieved.

According to the fourth aspect of the invention, the capacity measuring device enables the tremendously miniaturized MOS transistor to acquire an accurate parameter so that the preciseness of the design is increased.

What is claimed is:

1. A capacity measuring device comprising:

a semiconductor substrate;

an electric element provided on said semiconductor substrate and having a plurality of electrodes;

a plurality of first terminals each provided on said semiconductor substrate and electrically connected to each one of said electrodes of said electric element;

a plurality of guard rings made of conductor and arranged on said semiconductor substrate such that said guard rings surround said first terminals; and a second terminal electrically connected to said guard rings.

2. A method of measuring an electrostatic capacity between any two first terminals of the capacity measuring device according to claim 1 said method comprising the steps of:

disposing said capacity measuring device in a prober of a capacity measuring system and electrically connecting said second terminals of said capacity measuring device to said prober;

connecting one of said two first terminals to ground potential through a first shield wire, which has a first outside conductor connected to said prober so that said first outside conductor has a potential equal to a potential of said prober;

connecting a non-inverting input terminal of an operational amplifier to said prober so that said non-inverting input terminal has a potential equal to said potential of said prober, said operational amplifier having an output terminal connected to an inverting input terminal thereof through a feedback resistor;

connecting the other of said two first terminals to said inverting input terminal of said operational amplifier through a second shield wire, which has a second outside conductor connected to said prober so that said second outside conductor has a potential equal to said potential of said prober;

applying an alternating current signal between said non-inverting input terminal of said operational amplifier and said ground potential to provide an output voltage at said output terminal of said operational amplifier; and calculating a value of said electrostatic capacity between said two first terminals based upon said output voltage of said alternating current signal.

3. A capacity measuring device, comprising:

a semiconductor substrate;

an electric element provided on said semiconductor substrate and having a plurality of electrodes;

a plurality of first terminals each electrically connected to each one of said electrodes of said electric element;

a plurality of guard rings made of conductor and arranged such that said guard rings surround said first terminals; and a second terminal electrically connected to said guard rings, wherein said electric element comprises:

a device pattern formed on said semiconductor substrate, composed of a plurality of regions, and having a size and a shape substantially identical with those of a device which is formed in an integrated circuit and has a plurality of regions between which there are electrostatic capacities, of which values are to be found;

a first insulating layer formed on said device pattern;

a plurality of extension metal wirings formed on said first insulating layer and connecting said regions of said device pattern to a measuring apparatus;

a guard electrode formed on said first insulating layer by the same process as that of said extension metal wirings such that said guard electrode surrounds said extension metal wirings; and a second insulating layer formed on said extension metal wiring and guard electrode, said first terminals are formed on said second insulating layer and comprise a plurality of measurement terminals for connecting said extension metal wirings to said measuring apparatus, said guard rings are formed on said second insulating layer by the same process as that of said measurement terminals such that said guard rings surround said measurement terminals and electrically connected to said guard electrode, and said second terminal is formed on said second insulating layer by the same process as that of said measurement terminals for connecting said guard electrode to said measuring apparatus.

4. The capacity measuring device according to claim 3, wherein said device, of which electrostatic capacities are to be measured, is a MOS transistor.

5. A capacity measuring device, comprising:

a semiconductor substrate;

an electric element provided on said semiconductor substrate and having a plurality of electrodes;

a plurality of first terminals each electrically connected to each one of said electrodes of said electric element;

a plurality of guard rings made of conductor and arranged such that said guard rings surround said first terminals; and a second terminal electrically connected to said guard rings, wherein said electric element comprises:

a device pattern formed on said semiconductor substrate, composed of a plurality of regions, and having a size and a shape substantially identical with those of a device which is formed in an integrated circuit and has a plurality of regions between which there are electrostatic capacities, of which values are to be found;

a first insulating layer formed on said device pattern;

a plurality of first extension metal wirings formed on said first insulating layer and connecting a part of said regions of said device pattern to a measuring apparatus;

a guard electrode formed on said first insulating layer by the same process as that of said first extension metal wirings such that said guard electrode surrounds said first extension metal wirings;

a second insulating layer formed on said first extension metal wirings and guard electrode;

a plurality of second extension metal wirings formed on said second insulating layer and connecting other part of said regions of said device pattern to said measuring apparatus; and a third insulating layer formed on said second extension metal wirings, said first terminals are formed on said third insulating layer and comprise a plurality of measurement terminals for connecting said first and second extension metal wirings to said measuring apparatus, said guard rings are formed on said third insulating layer by the same process as that of said measurement terminals such that said guard rings surround said measurement terminals and electrically connected to said guard electrode, and said second terminal is formed on said third insulating layer by the same process as that of said measurement terminals for connecting said guard electrode to said measuring apparatus.

6. The capacity measuring device according to claim 5, wherein said device, of which electrostatic capacities are to be measured, is a MOS transistor.

* * * * *